(12) United States Patent
Mizuoka et al.

(10) Patent No.: US 10,695,713 B2
(45) Date of Patent: Jun. 30, 2020

(54) FLUX RECOVERY DEVICE, AND REFLOW APPARATUS AND GAS EXCHANGE METHOD USING THE SAME

(71) Applicant: Panasonic Intellectual Property Management Co., Ltd., Osaka (JP)

(72) Inventors: Seiji Mizuoka, Fukuoka (JP); Takahiro Endo, Yamanashi (JP); Yasuhiro Suzuki, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 256 days.

(21) Appl. No.: 15/866,763

(22) Filed: Jan. 10, 2018

(65) Prior Publication Data

US 2018/0214819 A1 Aug. 2, 2018

(30) Foreign Application Priority Data

| | | |
|---|---|---|
| Jan. 30, 2017 | (JP) | 2017-013885 |
| Jan. 30, 2017 | (JP) | 2017-013886 |
| Jan. 30, 2017 | (JP) | 2017-013887 |

(51) Int. Cl.

| | |
|---|---|
| *B01D 53/32* | (2006.01) |
| *B01D 53/30* | (2006.01) |
| *B23K 3/08* | (2006.01) |
| *B01D 53/00* | (2006.01) |
| *H05K 3/34* | (2006.01) |

(52) U.S. Cl.
CPC .......... *B01D 53/32* (2013.01); *B01D 53/002* (2013.01); *B01D 53/30* (2013.01); *B23K 3/08* (2013.01); *B01D 2258/0216* (2013.01); *B01D 2259/818* (2013.01); *H05K 3/3494* (2013.01)

(58) Field of Classification Search
CPC .................................................. B01D 53/32
USPC ................................................ 96/15, 18, 80
See application file for complete search history.

(56) References Cited

U.S. PATENT DOCUMENTS 5,900,043 A 5/1999 Grandjean et al.

FOREIGN PATENT DOCUMENTS

| | | | | |
|---|---|---|---|---|
| JP | S55-127161 | A | 10/1980 | |
| JP | H10-034017 | A | 2/1998 | |
| JP | 2003-001411 | A | 1/2003 | |
| JP | 2003-074891 | A | 3/2003 | |
| JP | 2008-124112 | A | 5/2008 | |
| JP | 2008-246514 | A | 10/2008 | |
| JP | 2010-240595 | A | 10/2010 | |
| JP | 4580590 | B2 | 11/2010 | |
| JP | 2016-067166 | A | 4/2016 | |
| KR | 2004006402 | A * | 1/2004 | ............. B01D 53/32 |
| WO | 2015/134156 | A1 | 9/2015 | |

* cited by examiner

*Primary Examiner* — Robert A Hopkins
(74) *Attorney, Agent, or Firm* — Pearne & Gordon LLP

(57) ABSTRACT

A flux recovery device recovers a vaporized flux being generated at a time of soldering an electronic circuit board on which electronic components are placed. The flux recovery device includes a first pipe, a dust collector, and a current controller. The first pipe causes gas including the vaporized flux to pass to the flux recovery device. The dust collector solidifies the vaporized flux passed through the first pipe and collects dust, by a plasma discharge. The current controller performs a constant current control of the plasma discharge.

9 Claims, 7 Drawing Sheets

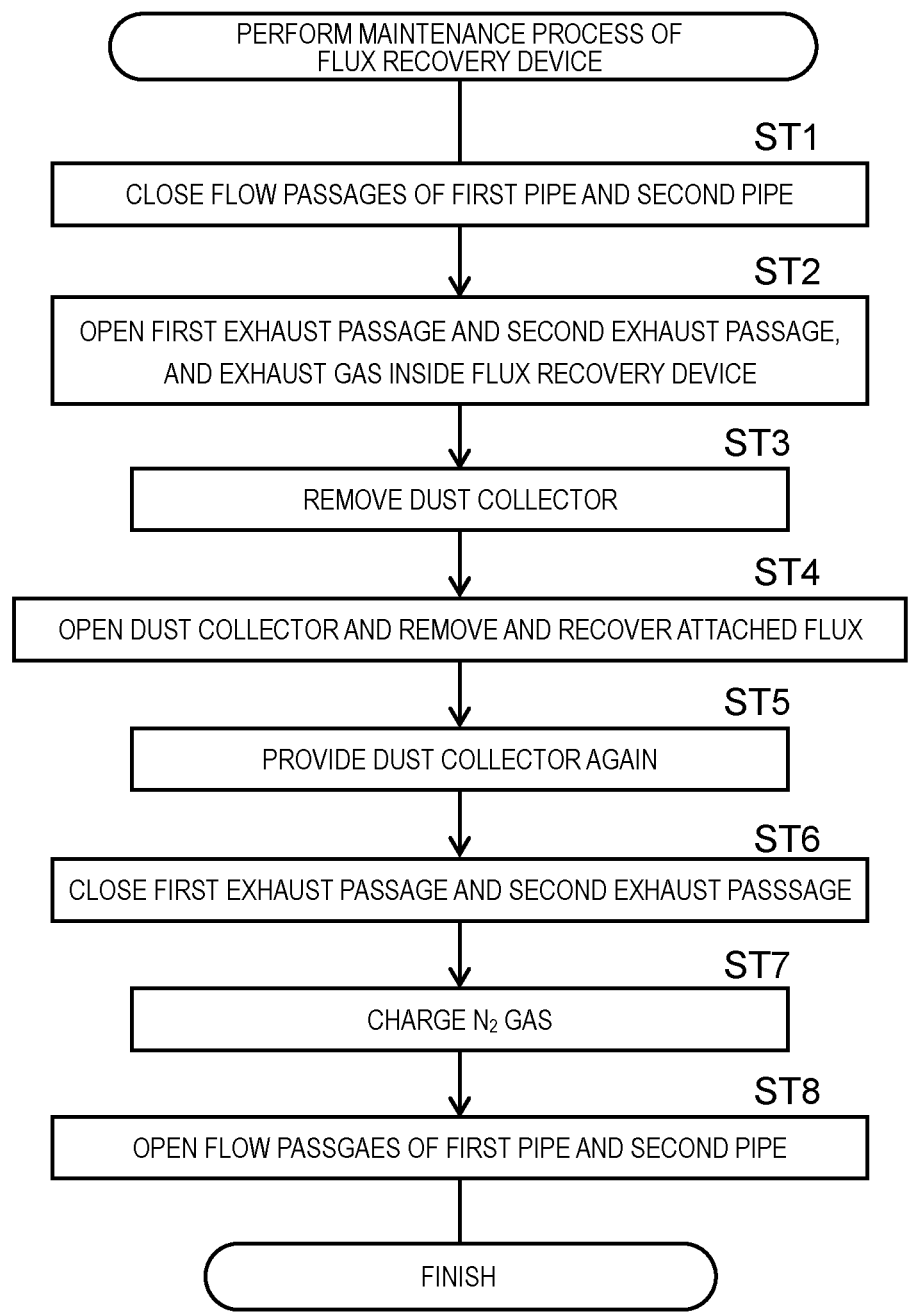

FLUX RECOVERY DEVICE, AND REFLOW APPARATUS AND GAS EXCHANGE METHOD USING THE SAME

BACKGROUND

1. Technical Field

The present disclosure relates to a flux recovery device recovering a vaporized flux being generated by a reflow process in a mounting board manufacturing, and a reflow apparatus and a gas exchange method using the flux recovery device.

2. Description of the Related Art

In a board manufacturing process of manufacturing an electronic circuit board on which electronic components are placed, a board in which electronic components are placed at a solder position is carried in the reflow apparatus. A paste type cream solder including solder particles in flux components is applied to the solder position of the board in advance. In the reflow apparatus, the board is heated in a predetermined heating pattern, and thus the electronic components are soldered to electrodes of the board by melting the solder particles in the cream solder.

In the solder, exhaust gas including a vaporized flux in which flux components in the cream solder are heated and vaporized is generated. In a process in which the exhaust gas flows in the reflow apparatus, when the vaporized flux comes into contact with an inner surface such as an inner wall or a ceiling surface of the reflow apparatus and is cooled at a temperature equal to or less than the dew point, the flux which is liquefied or solidified from a gas state is attached to the inner surface. When the attachment proceeds, a defect in which the attached and deposited flux may drop and a board of a work object is contaminated may be generated.

As a countermeasure against such a defect caused by the vaporized flux, a method of attracting and recovering the vaporized flux by charging the vaporized flux is known (refer to PTL 1). In a prior art disclosed in PTL 1, gas including a vaporized flux generated when the electronic components are soldered to a print circuit board is charged by a corona discharge which is a type of a plasma discharge. Thus, the vaporized flux is attracted, aggregated, and liquefied by a recovering portion which is charged with an opposite polarity to the charged vaporized flux. In such a configuration, a detector of the vaporized flux is disposed inside the flux recovery device, and a discharge amount of the corona discharge is adjusted depending on an amount of the detected vaporized flux.

CITATION LIST

Patent Literature

PTL 1: Japanese Patent No. 4580590

SUMMARY

A flux recovery device of this disclosure recovers the vaporized flux being generated at a time of soldering an electronic circuit board on which electronic components are placed.

The flux recovery device includes a first pipe, a dust collector, and a current controller.

The first pipe causes gas including the vaporized flux to pass to the flux recovery device.

The dust collector solidifies the vaporized flux passed through the first pipe and collects dust, by a plasma discharge.

The current controller performs a constant current control of the plasma discharge.

A flux recovery device of another disclosure includes a first pipe, a dust collector, and a discharge controller.

The discharge controller controls a discharge amount of the plasma discharge.

A flux recovery device of still another disclosure includes a first pipe, a dust collector, and a first joint portion.

The first joint portion causes the first pipe and the dust collector to be attachable to and detachable from each other.

A flux recovery device of still yet another disclosure includes a first pipe, a dust collector, a first exhaust passage provided in the first pipe, a first intake passage provided in the first pipe, a first exhaust valve which opens and closes a flow passage of the first exhaust passage, a first intake valve which opens and closes a flow passage of the first intake passage, and a first pipe valve which opens and closes a flow passage of the first pipe.

The reflow apparatus of the disclosure includes the flux recovery device described above.

A gas exchange method in the flux recovery device of the disclosure is a gas exchange method inside a flux recovery device for recovering the vaporized flux being generated at the time of soldering the electronic circuit board on which the electronic components are placed.

The gas exchange method includes a first pipe closing process of closing the flow passage of the first pipe which causes the gas including the vaporized flux to pass to the flux recovery device, and a first exhaust passage opening process of opening the first exhaust passage provided in the first pipe.

BRIEF DESCRIPTION OF THE DRAWINGS

FIG. 6 is a flow diagram of a maintenance process in the flux recovery device of the embodiment;

DETAILED DESCRIPTION

In a flux recovery device of the related art, there is a case in which a vaporized flux in gas cannot be properly charged and efficiently recovered. That is, regarding the flux recovery device in a plasma discharge method, a flux which is aggregated is attached to not only an inner wall and a ceiling surface but also a detector of the vaporized flux disposed inside. Therefore, an amount of the vaporized flux in the flux recovery device cannot be correctly detected, and as a result, there is a case in which properly adjusting a discharge amount of a plasma discharge for charging and recovering the vaporized flux may be difficult.

Since the reflow apparatus is continuously operated for a long time, contamination of the board or the inner surface of the apparatus due to the vaporized flux continuously proceeds during being operated. Therefore, in order to prevent a defect caused by such contamination, it is required to simply perform a maintenance work for removing the flux of an object to be recovered in which the vaporized flux is aggregated so far as possible with good workability. However, in the related art including PTL 1, the maintenance work for removing the object to be recovered in which the vaporized flux is aggregated and solidified is not disclosed, and a manner for improving the workability of the maintenance work is required.

Next, the embodiment will be described with reference to drawings. First, with reference to FIG. 1, the entire configuration of reflow apparatus 1 in the embodiment will be described. Reflow apparatus 1 has a function of soldering the electronic circuit board on which electronic components are placed by a component placing device in an electronic circuit board manufacturing line for manufacturing an electronic circuit board on which electronic components are placed on a board.

Figure 1:
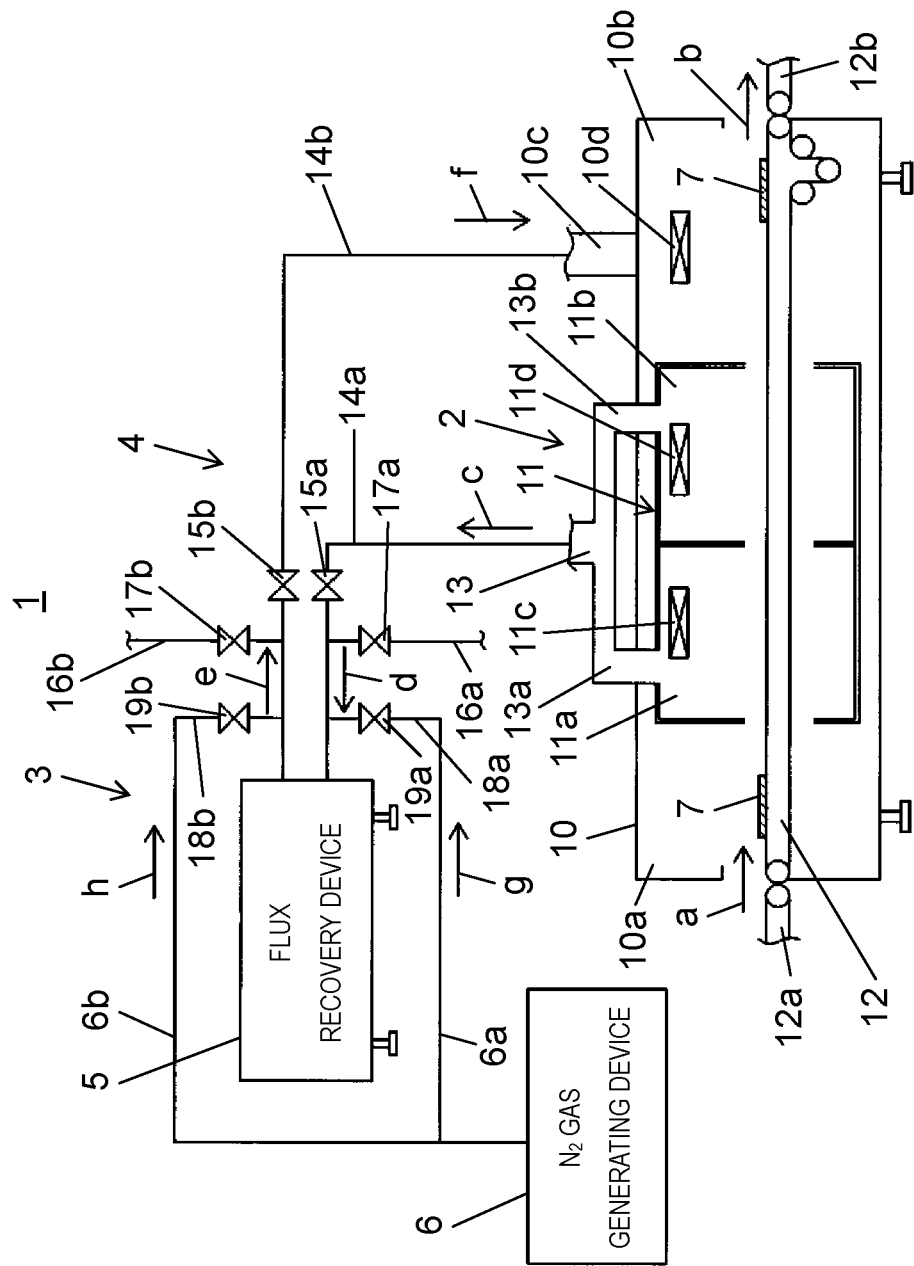
FIG. 1 is a configuration exemplary view of a reflow apparatus including a flux recovery device of an embodiment.

In FIG. 1, reflow apparatus 1 includes reflow furnace 2, recovering portion 3, and pipe 4. Reflow furnace 2 heats and cools the electronic circuit board on which the components are placed which is carried by the component placing device on an upstream side according to a predetermined heating profile. Accordingly, the component is attached to the board by melting and solidifying solder components in cream solder supplied to the solder part in a previous process of placing the components. Recovering portion 3 has a function of solidifying and recovering the vaporized flux being generated when flux components in the cream solder supplied to the solder part are vaporized due to heating at the time of soldering by reflow furnace 2.

Pipe 4 has a function of guiding exhaust gas including the vaporized flux discharged from reflow furnace 2 to recovering portion 3, and of returning the gas in which the vaporized flux is removed by recovering portion 3 to reflow furnace 2. That is, reflow apparatus 1 described in the embodiment is configured with flux recovery device 5 which recovers the vaporized flux being generated at the time of soldering the electronic circuit board on which the electronic components are placed.

Hereinafter, configurations of reflow furnace 2, recovering portion 3, and pipe 4 will be described. In FIG. 1, reflow furnace 2 has a configuration in which heating furnace 11 is disposed inside enclosing cover case 10 and reflow conveyor 12 which penetrates cover case 10 from an upstream side to a downstream side is provided. Reflow conveyor 12 is connected to taking-out conveyor 12a of the apparatus on an upstream side and to carrying-in conveyor 12b of the apparatus on a downstream side. Reflow conveyor 12 receives electronic circuit board 7 in which the components are placed from taking-out conveyor 12a (arrow a), and thus electronic circuit board 7 is carried into guiding portion 10a of cover case 10.

In heating furnace 11 disposed on a downstream of guiding portion 10a, pre-heating zone 11a including pre-heating unit 11c and main heating zone 11b including main heating unit 11d are respectively provided. When pre-heating unit 11c and main heating unit 11d are operated, the inside of pre-heating zone 11a and the inside of main heating zone 11b are maintained at a predetermined temperature atmosphere. When electronic circuit board 7 carried in heating furnace 11 by reflow conveyor 12 is sequentially moved to pre-heating zone 11a and main heating zone 11b, electronic circuit board 7 is heated in accordance with a predetermined temperature profile. Accordingly, the solder components in the cream solder in the solder part of electronic circuit board 7 are melted.

Next, electronic circuit board 7 is moved to cooling zone 10b taken-out from heating furnace 11. Cooling unit 10d is provided in cooling zone 10b, and electronic circuit board 7 moved to cooling zone 10b is cooled by operating cooling unit 10d. Accordingly, melted solder is solidified in the solder part, and thus the solder is completed. Carrying-in conveyor 12b of the apparatus on the downstream side receives electronic circuit board 7 after being soldered from reflow conveyor 12 (arrow b), and the electronic circuit board is taken out to the downstream side.

When heating is performed by heating furnace 11 described above, gas including the vaporized flux, which is vaporized by heating the flux components in the cream solder, is generated. In a ceiling surface of pre-heating zone 11a and main heating zone 11b, branch portions 13a and 13b of which exhaust duct 13 is branched open. According to such a configuration, gas including the vaporized flux generated inside pre-heating zone 11a and main heating zone 11b is exhausted from exhaust duct 13 through branch portions 13a and 13b.

First pipe 14a constituting pipe 4 is connected to exhaust duct 13. First pipe 14a is connected to flux recovery device 5 through first pipe valve 15a which opens and closes a flow passage of first pipe 14a. First exhaust passage 16a is connected to first pipe 14a, and first exhaust passage 16a is opened to the outside through first exhaust valve 17a.

First intake passage 18a is connected to first pipe 14a through first intake valve 19a. First intake passage 18a is connected to $N_2$ gas generating device 6 through $N_2$ gas supplying tube 6a. $N_2$ gas generating device 6 has a function of generating $N_2$ gas (nitrogen gas) for causing atmosphere heating furnace 11 where a reflow process is performed to be inert atmosphere. When first intake valve 19a is opened, $N_2$ gas generated by $N_2$ gas generating device 6 flows into first pipe 14a through $N_2$ gas supplying tube 6a and first intake passage 18a (arrow g).

When first pipe valve 15a is opened, the exhaust gas from exhaust duct 13 is sent to flux recovery device 5 through first pipe 14a (arrows c and d), the vaporized flux during exhausting is recovered in flux recovery device 5. Second pipe 14b which penetrates return duct 10c opened to cooling zone 10b of reflow furnace 2 is connected to flux recovery device 5. Second pipe valve 15b which opens and closes a flow passage of second pipe 14b is provided in second pipe 14b. When second pipe valve 15b is opened, the gas after the vaporized flux is recovered by flux recovery device 5 is recirculated to cooling zone 10b through second pipe 14b (arrows e and f).

Second exhaust passage 16b is connected to second pipe 14b. Second exhaust passage 16b is opened to the outside through second exhaust valve 17b. Second intake passage 18b is connected to second pipe 14b through second intake valve 19b. Second intake passage 18b is connected to $N_2$ gas generating device 6 through $N_2$ gas supplying tube 6b. When second intake valve 19b is opened, $N_2$ gas generated by $N_2$ gas generating device 6 flows second pipe 14b through second intake passage 18b (arrow h).

Figure 2:
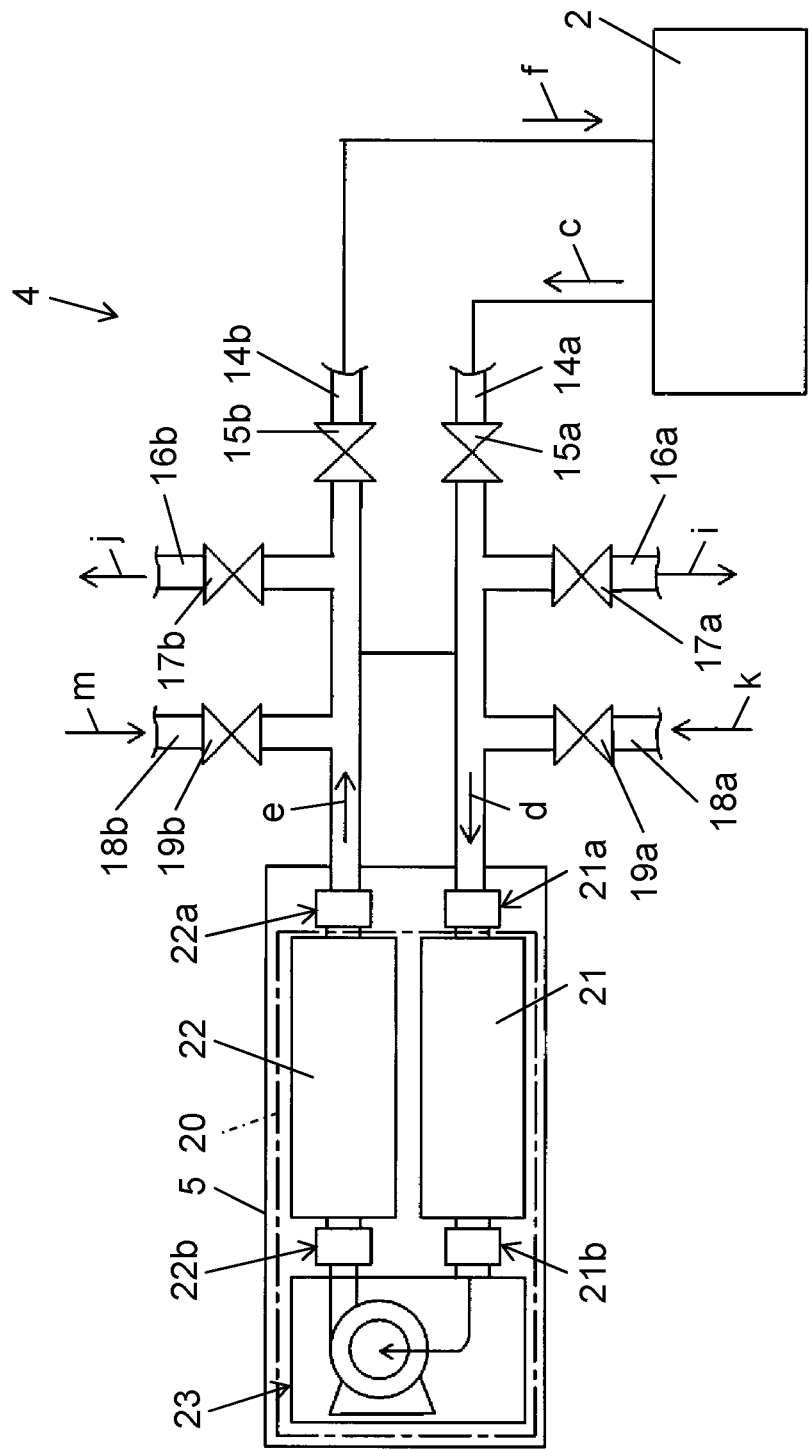
FIG. 2 is a configuration exemplary view of the flux recovery device of the embodiment.

Next, with reference to FIG. 2, configurations and functions of flux recovery device 5 and pipe 4 will be described. In FIG. 2, flux recovery device 5 includes dust collector 20 including first dust collector 21, second dust collector 22, and circulation pan 23. First pipe 14a which causes the gas including the vaporized flux being sent from reflow furnace 2 to pass is attachably and detachably connected to an end portion on an entrance side (right side in FIG. 2) of first dust collector 21 through first one-touch joint 21a.

Figure 4:
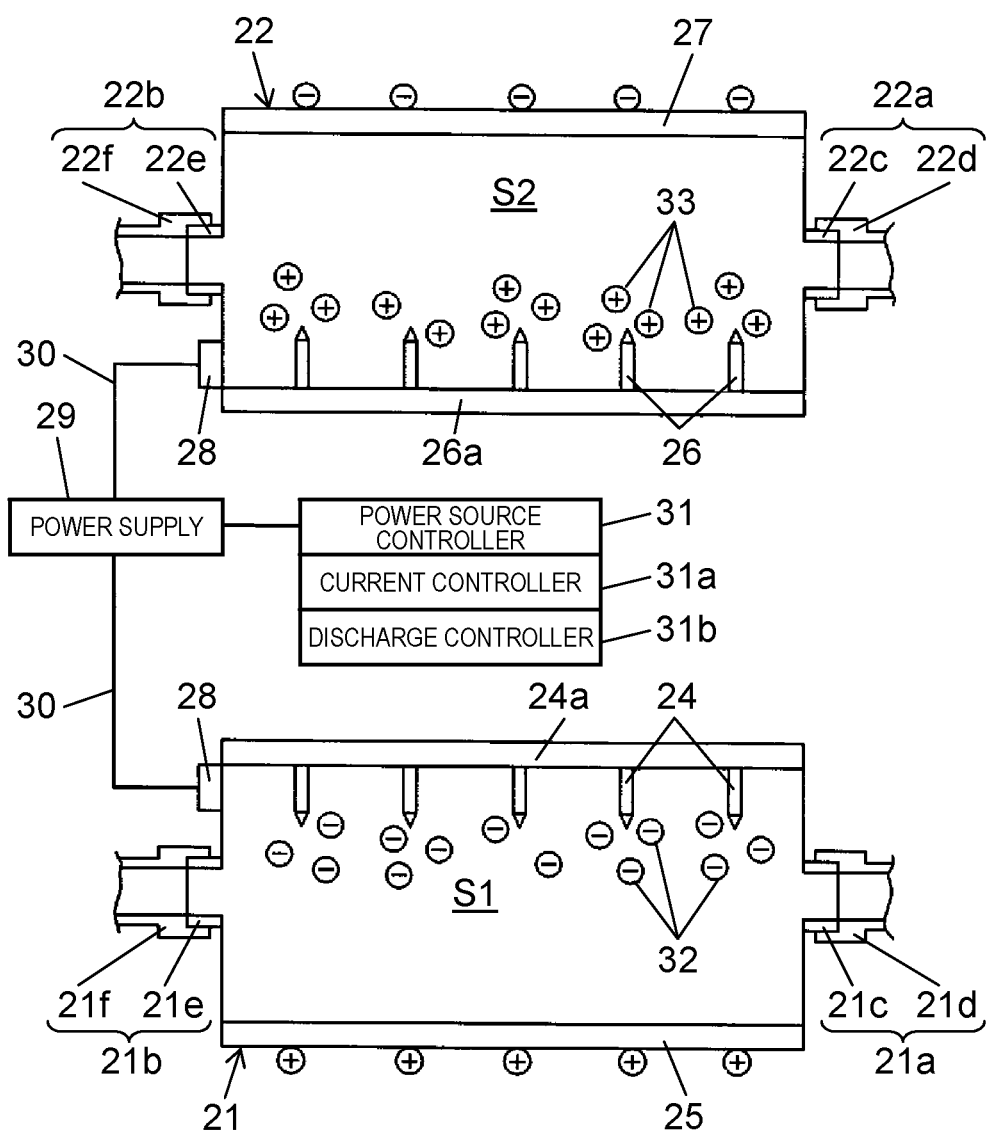
FIG. 4 is an explanatory view of a configuration and a function of a dust collector of the flux recovery device of the embodiment.

First dust collector 21 has a function of solidifying the vaporized flux passed through first pipe 14a and collecting dust using a plasma discharger illustrated in FIG. 4. First one-touch joint 21a is a first joint portion which causes first pipe 14a and first dust collector 21 of dust collector 20 to be attachable to and detachable from each other. As illustrated in FIG. 4, first one-touch joint 21a has a configuration in which adapter 21c protruded and provided to the end portion of first dust collector 21 and coupler 21d freely detachable from adapter 21c are combined.

Second pipe 14b which causes the gas recirculated by reflow furnace 2 to pass is attachably and detachably connected to the end portion on an exit side (right side in FIG. 2) of second dust collector 22 after the vaporized flux is collected through second one-touch joint 22a. Second one-touch joint 22a is a second joint portion which causes second pipe 14b and second dust collector 22 of dust collector 20 to be attachable to and detachable from each other. Second one-touch joint 22a has a configuration in which adapter 22c protruded and provided to the end portion of second dust collector 22 and coupler 22d freely detachable from adapter 22c are combined (refer to FIG. 4).

Circulation pan 23 is attachably and detachably connected to an end portion on an exit side (left side in FIG. 2) of first dust collector 21 through third one-touch joint 21b. Third one-touch joint 21b has a configuration in which adapter 21e protruded and provided to the end portion of first dust collector 21 and coupler 21f freely detachable from adapter 21e are combined (refer to FIG. 4). Second dust collector 22 is attachably and detachably connected to an end portion on an exit side (right side in FIG. 2) of circulation pan 23 through fourth one-touch joint 22b. Fourth one-touch joint 22b has a configuration in which adapter 22e protruded and provided to the end portion of second dust collector 22 and coupler 22f freely detachable from adapter 22e are combined (refer to FIG. 4).

Circulation pan 23 has a function of circulating the gas including the vaporized flux passed through first dust collector 21. Second dust collector 22 solidifies the vaporized flux passed through circulation pan 23 by the plasma discharger illustrated in FIG. 4. In this configuration, when circulation pan 23 is operated, the gas which is sent to dust collector 20 of flux recovery device 5 from reflow furnace 2 and of which the vaporized flux is collected can be circulated between reflow furnace 2 and flux recovery device 5, and thereby making it possible to improve a heating efficiency in reflow furnace 2.

In the configuration described above, third one-touch joint 21b is a third joint portion which causes first dust collector 21 and circulation pan 23 to be attachable to and detachable from each other, and fourth one-touch joint 22b is a fourth joint portion which causes second dust collector 22 and circulation pan 23 to be attachable to and detachable from each other. With such a configuration, dust collector 20 constituted by first dust collector 21 and second dust collector 22 can be removed from flux recovery device 5. Accordingly, the maintenance work in which the flux attached to the inside of first dust collector 21 and second dust collector 22 is removed can be performed with good workability in a state in which first dust collector 21 and second dust collector 22 are removed from flux recovery device 5.

Next, a function of pipe 4 will be described. As illustrated in FIG. 2, first pipe valve 15a which opens and closes the flow passage of first pipe 14a is provided in first pipe 14a which causes the gas including the vaporized flux exhausted to dust collector 20 from reflow furnace 2 to pass. In addition, second pipe valve 15b which opens and closes a flow passage of second pipe 14b is provided in second pipe 14b which causes the gas after the vaporized flux is collected by dust collector 20 to pass.

In a general operating state, both first pipe valve 15a and second pipe valve 15b are opened, and the exhaust gas being sent from reflow furnace 2 is sent to first dust collector 21 through first pipe 14a (arrows c and d). The gas after the vaporized flux is collected by dust collector 20 is sent to second dust collector 22 by circulation pan 23, and then the vaporized flux is collected again. The gas after the vaporized flux is collected is recirculated by reflow furnace 2 through second pipe 14b (arrows e and f). At this time, when first pipe valve 15a and second pipe valve 15b are closed, circulation of the gas between reflow furnace 2 and flux recovery device 5 is blocked. Accordingly, at the time of performing a work such as maintenance, flux recovery device 5 can be opened in a state in which sending the gas from reflow furnace 2 is blocked.

First exhaust passage 16a and first intake passage 18a are provided in first pipe 14a. First exhaust passage 16a includes first exhaust valve 17a which opens and closes the flow passage of first exhaust passage 16a. First intake passage 18a includes first intake valve 19a which opens and closes the flow passage of first intake passage 18a. Second exhaust passage 16b and second intake passage 18b are provided in second pipe 14b. Second exhaust passage 16b includes second exhaust valve 17b which opens and closes the flow passage of second exhaust passage 16b. Second intake passage 18b includes second intake valve 19b which opens and closes the flow passage of second intake passage 18b.

In a state in which first pipe valve 15a and second pipe valve 15b are closed, when first exhaust valve 17a and second exhaust valve 17b are opened, the gas inside flux recovery device 5 can be discharged to the outside through first exhaust passage 16a and second exhaust passage 16b. In addition, when first intake valve 19a and second intake valve 19b are opened, $N_2$ gas generated by $N_2$ gas generating device 6 can be introduced into first pipe 14a and second pipe 14b.

Figure 3:
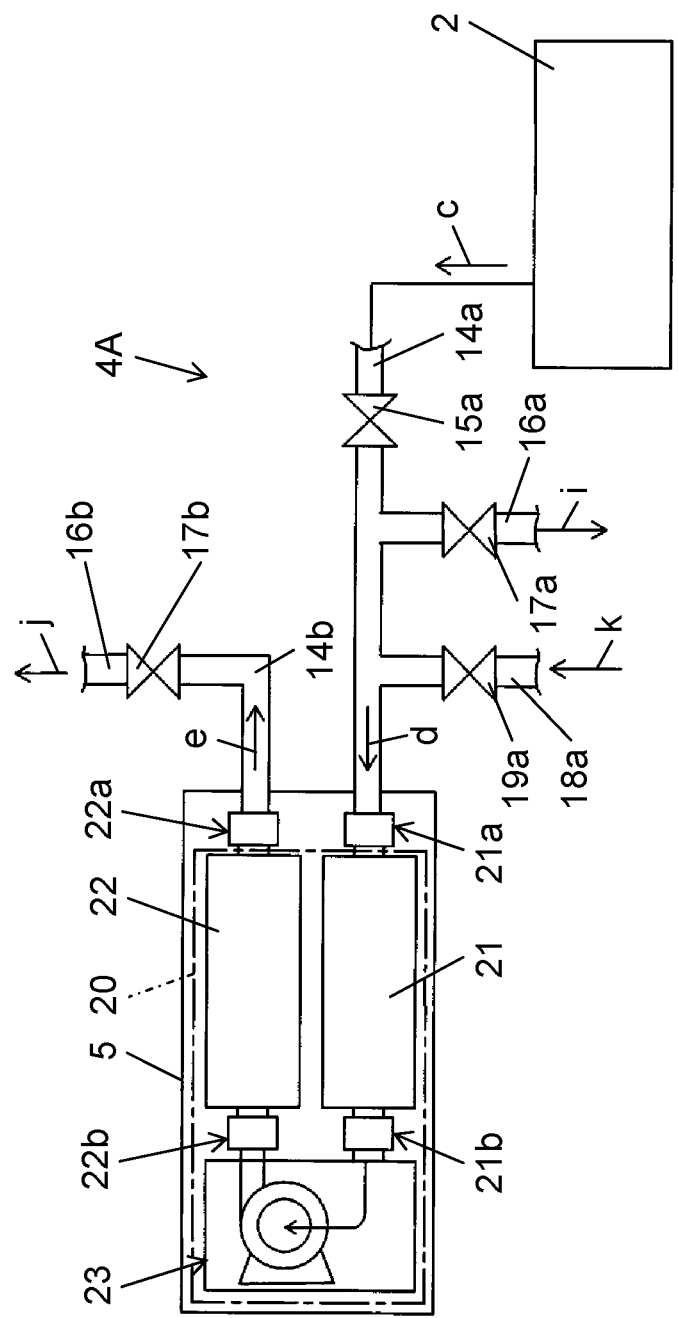
FIG. 3 is a configuration exemplary view of the flux recovery device of the embodiment.

Instead of the configuration of pipe 4 illustrated in FIG. 2, pipe 4A having a simple configuration illustrated in FIG. 3 may be used. In pipe 4A, second exhaust passage 16b including second exhaust valve 17b is only provided in second pipe 14b connected to first dust collector 21. Here, second exhaust valve 17b is opened in a general operating state, and the gas which is sent to flux recovery device 5 from reflow furnace 2 through first pipe 14a is circulated and is not recirculated by reflow furnace 2, and is released to the outside from second exhaust passage 16b (arrow j). When such a configuration is adopted, it is possible to simplify a facility configuration and to achieve reducing costs of the facility.

Next, with reference to FIGS. 4 and 5, a configuration and a function of dust collector 20 in flux recovery device 5 will be described. Dust collector 20 has a configuration in which first dust collector 21 and second dust collector 22 which are substantially rectangular parallelepiped box shape (refer to FIGS. 7A and 7B) are disposed in parallel to each other inside flux recovery device 5. FIG. 4 schematically illustrates a horizontal sectional surface of first dust collector 21 and second dust collector 22.

As illustrated in FIG. 4, first dust collector 21 and second dust collector 22 have basically the same structure as each other. In first dust collector 21, needle electrodes 24 held by electrode holder 24a and dust collecting electrode 25 are disposed to face each other. In second dust collector 22, needle electrodes 26 held by electrode holder 26a and dust collecting electrode 27 are disposed to face each other.

Both of needle electrodes 24 and 26 are an electrode for the plasma discharge, which includes a distal end portion in a sharp shape. In the embodiment, dust collector 20 includes electrode holders 24a and 26a which are symmetrically disposed to each other. Space S1 between electrode holder 24a and dust collecting electrode 25 in first dust collector 21 and space S2 between electrode holder 26a and dust collecting electrode 27 in second dust collector 22 form a processing space in which the gas including the vaporized flux is guided and collecting process is performed.

Figure 7A:
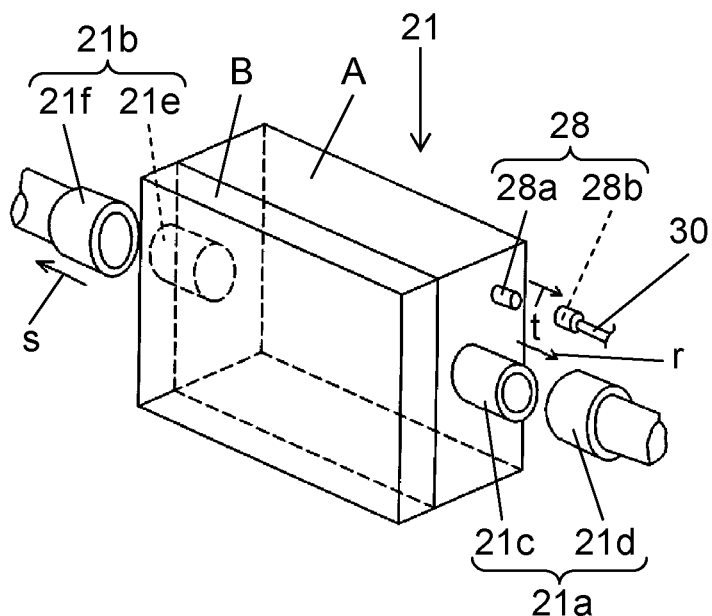
FIG. 7A is an explanatory view of the maintenance process in the flux recovery device of the embodiment.
Figure 7B:
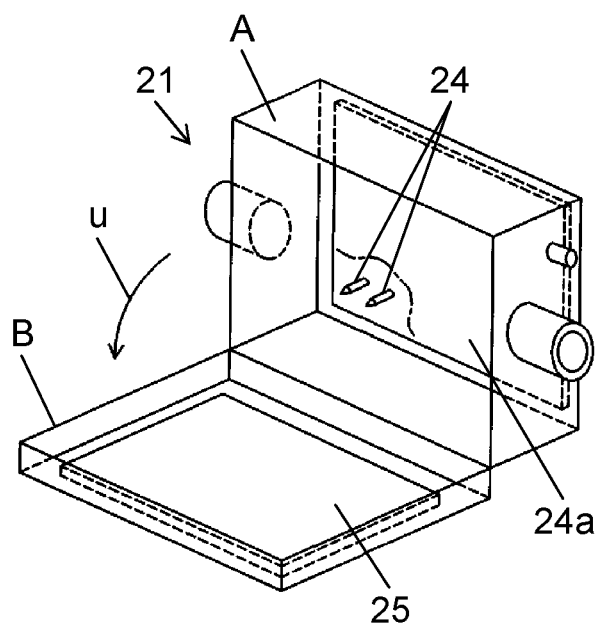
FIG. 7B is an explanatory view of the maintenance process in the flux recovery device of the embodiment.

As illustrated in FIGS. 7A and 7B, first dust collector 21 and second dust collector 22 are divided into box shaped portion A where needle electrodes 24 and 26 are provided and cover portion B where dust collecting electrodes 25 and 27 are provided, and internal maintenance can be performed by opening cover portion B with respect to box shaped portion A.

As illustrated in FIG. 4, flux recovery device 5 includes power supply 29 which supplies power source to dust collector 20. Power source controller 31 controls and operates power supply 29, and thus power is supplied to first dust collector 21 and second dust collector 22 of dust collector 20 through power line 30 connected to power supply 29. Power line 30 includes power supply 29 and connector 28 which causes first dust collector 21 and second dust collector 22 to be attachable to and detachable from each other.

That is, as illustrated in FIG. 7A, connection protrusion 28a constituting connector 28 is protruded and provided in first dust collector 21 and second dust collector 22. Connection recessed portion 28b connected to an end portion of power line 30 is attached to and detached from connection protrusion 28a, and thus power line 30 is attached to and detached from first dust collector 21 and second dust collector 22. Accordingly, power line 30 is configured to be attachable to and detachable from first dust collector 21 and second dust collector 22, and thereby it is possible to perform the maintenance work in which the flux attached to the inside of first dust collector 21 and second dust collector 22 is removed with good workability in a state in which first dust collector 21 and second dust collector 22 are taken out from flux recovery device 5.

When power is supplied to first dust collector 21 and second dust collector 22 by power supply 29, the voltages are applied between needle electrodes 24 and dust collecting electrode 25, and between needle electrodes 26 and dust collecting electrode 27, and the plasma discharge can be generated inside spaces S1 and S2 of first dust collector 21 and second dust collector 22. The plasma discharge causes to generate ions inside spaces S1 and S2 (FIG. 4). Needle electrodes 24 and power supply 29 are the plasma discharger in first dust collector 21. Needle electrodes 26 and power supply 29 are the plasma discharger in second dust collector 22.

Depending on the polarity of needle electrodes 24 and 26 in the voltage applying, the polarities of the ions being generated in spaces S1 and S2 are different from each other. That is, when power source is supplied to first dust collector 21 by power supply 29, a voltage for setting needle electrodes 24 as a negative electrode and dust collecting electrode 25 as a positive electrode is applied between needle electrodes 24 and dust collecting electrode 25. Accordingly, negative ions 32 are generated near distal end portions of needle electrodes 24, and the generated negative ions 32 moves inside space S1. With respect that, when power source is supplied to second dust collector 22 by power supply 29, a voltage for setting needle electrodes 26 as a negative electrode and dust collecting electrode 27 as a positive electrode is applied between needle electrodes 26 and dust collecting electrode 27. Accordingly, positive ions 33 are generated near distal end portions of needle electrodes 26, and the generated positive ions 33 move inside space S2.

Figure 5:
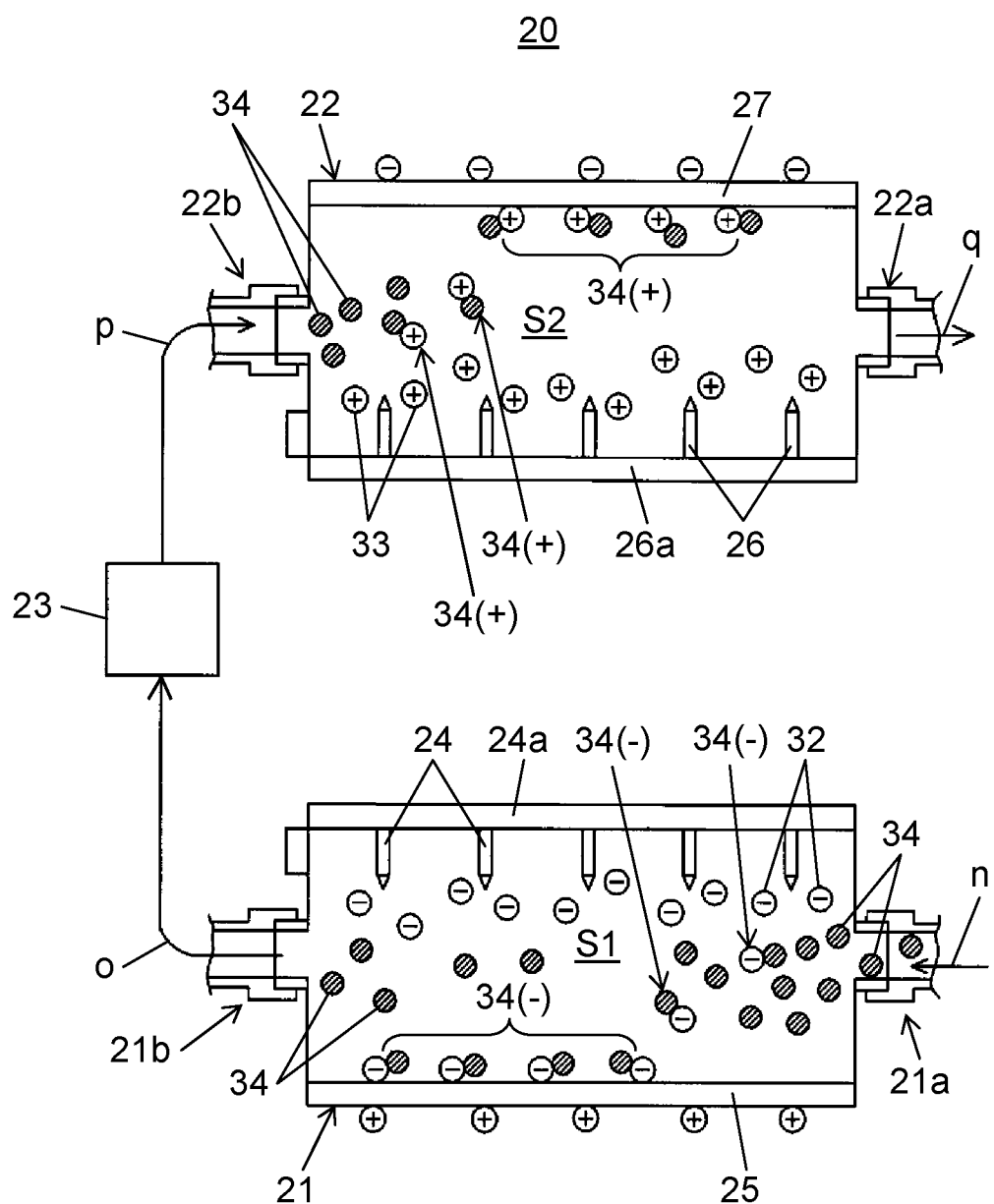
FIG. 5 is an explanatory view of the configuration and the function of the dust collector of the flux recovery device of the embodiment.

FIG. 5 schematically illustrates a state when the plasma discharger described above is operated in a state in which the vaporized flux is passed through dust collector 20. The gas of an object to be processed including the vaporized flux is sent into space S1 of first dust collector 21 (arrow n) from first pipe 14a (refer to FIG. 2) through first one-touch joint 21a, and vaporized flux particles 34 in gas are sent into space S1.

At this time, the gas inside space S1 by operating circulation pan 23 is sucked from third one-touch joint 21b to the outside (arrow o), and the gas flows from first one-touch joint 21a toward third one-touch joint 21b inside space S1. In vaporized flux particles 34 moved due to the flowing the gas, positively charged particles are attracted to and captured by negative ions 32 present inside space S1. Accordingly, vaporized flux particles 34 captured by negative ions 32 become negatively charged vaporized flux particles 34 (−), are attracted to and attached by positively charged dust collecting electrode 25 which has an opposite polarity, and collected.

Next, the gas sucked from third one-touch joint 21b to the outside is sent into space S2 of second dust collector 22 through fourth one-touch joint 22b by circulation pan 23 (arrow p). In the gas, vaporized flux particles 34 which are not an object to be collected by first dust collector 21, that is, negatively charged vaporized flux particles 34 are included. Vaporized flux particles 34 are attracted to and captured by positive ions 33 present inside space S2.

Accordingly, vaporized flux particles 34 captured by positive ions 33 become positively charged vaporized flux particles 34 (+), are attracted and attached to negatively charged dust collecting electrode 27 which has an opposite polarity, and collected. As seen from the above, the gas after becoming the object to be collected at two stages by first dust collector 21 and second dust collector 22 is sent to second pipe 14b (refer to FIG. 2) through second one-touch joint 22a (arrow q).

In flux recovery device 5 described in the embodiment, power supply 29 in the plasma discharger being used for collecting for the vaporized flux described above is controlled in a control method as follows. That is, as illustrated in FIG. 4, power source controller 31 controlling power supply 29 is configured to have two control functions of current controller 31a and discharge controller 31b.

Current controller 31a controls power supply 29 constituting the plasma discharger by a control pattern for a constant current control. In the control pattern, regardless of an attaching state of the flux to needle electrodes 24 and 26 or dust collecting electrodes 25 and 27, a voltage being applied between the electrodes is controlled, such that current in the plasma discharge is maintained at a current value set in advance.

That is, in a process in which flux recovery device 5 is continuously operated, contamination of which the flux, in which the vaporized flux is solidified, is attached to the inside of flux recovery device 5, such as needle electrodes 24 and 26 or dust collecting electrodes 25 and 27, is generated, and thus a discharge amount in the plasma discharge tends to be reduced and a collecting action tends to be deteriorated. Even in such a state, the constant current control described above is adopted, and thus it is possible to increase the discharge amount depending on a contamination state inside flux recovery device 5, that is, the amount of the vaporized flux which becomes an object to be collected in flux recovery device 5, and to maintain the desired collecting action.

In addition, discharge controller 31b controls power supply 29 with a control pattern for controlling the discharge amount of the plasma discharger. That is, in the control pattern, the discharge amount necessary for maintaining the desired collecting action is increased depending on an operating state of reflow furnace 2. For example, the discharge amount is increased in proportion to increase of the number of electronic circuit boards 7 being processed inside reflow furnace 2. Otherwise, the discharge amount is increased in proportion to an elapse of the operation time of reflow furnace 2. Even in any example, power supply 29 is controlled, such that the discharge amount is increased depending on the contamination state inside of flux recovery device 5 which is predicted depending on the operating state, that is, the amount of the vaporized flux which becomes the object to be collected in flux recovery device 5.

With such a control method, it is possible to improve a control manner for controlling the plasma discharger based on a detection result of a detector of the vaporized flux disposed inside the flux recovery device. That is, the plasma discharger is controlled based on incorrect detection result caused by attaching the aggregated flux to the detector such as a sensor, and thereby it is possible to prevent defect faulty controlling the discharge amount.

Next, the maintenance process of flux recovery device 5 being performed in a process in which reflow apparatus 1 is continuously operated will be described with reference to a flow of FIG. 6. In the operating state of reflow apparatus 1, the gas to be processed is sent to flux recovery device 5 from reflow furnace 2 through first pipe 14a, and the returned gas of which the collecting process is finished by flux recovery device 5 is recirculated to reflow furnace 2 through second pipe 14b. In the maintenance process performed here, a work in which the flux is attached to the inside of dust collector 20 of flux recovery device 5 by being collected is removed is performed.

At the time of the maintenance work, first, flow passages of first pipe 14a and second pipe 14b are closed (ST1). That is, first pipe valve 15a and second pipe valve 15b are closed, and thus flow of the gas between flux recovery device 5 and reflow furnace 2 is blocked. Next, first exhaust passage 16a and second exhaust passage 16b are closed, and the gas inside flux recovery device 5 is exhausted (ST2). That is, first exhaust valve 17a and second exhaust valve 17b are closed, and thus the gas inside dust collector 20 of flux recovery device 5 is exhausted from first exhaust passage 16a and second exhaust passage 16b to the outside. Accordingly, the gas at a high temperature remaining inside dust collector 20 is exhausted, and dust collector 20 is opened by a user so as to be capable of performing the maintenance work.

Next, dust collector 20 which becomes a work object is removed (ST3). Here, first dust collector 21 and second dust collector 22 constituting dust collector 20 are removed and taken out to the outside of flux recovery device 5. At the time of removing first dust collector 21, as illustrated in FIG. 7A, coupler 21d is separated from adapter 21c in first one-touch joint 21a (arrow r), coupler 21f is separated from adapter 21e in third one-touch joint 21b (arrow s), and connection recessed portion 28b is separated from connection protrusion 28a in connector 28 (arrow t). Only an example of working in which first dust collector 21 becomes the work object is illustrated in FIGS. 7A and 7B; however, a case in which second dust collector 22 is a work object is also the same as the example.

When a connection part of first dust collector 21 is separated as described above, first dust collector 21 is opened in a state in which first dust collector 21 is removed from flux recovery device 5, and the flux attached to the inside is removed and recovered (ST4). That is, as illustrated in FIG. 7B, cover portion B in which dust collecting electrode 25 is provided is opened with respect to box shaped portion A in which needle electrodes 24 are provided (arrow u), a work of removing the flux attached to the inside of first dust collector 21, such as needle electrodes 24, electrode holder 24a, and dust collecting electrode 25, is performed. In this work, first dust collector 21 is placed at a position with good working environment of being removed from flux recovery device 5. Also, since first dust collector 21 becomes in a state in which the opened inside reveals, the maintenance work can be performed with good workability in an excellent circumstance.

Next, dust collector 20 in which maintenance is completed is provided again (ST5). That is, first dust collector 21 and second dust collector 22 in which the flux attached to the inside is completed to be removed are disposed inside flux recovery device 5, and first one-touch joint 21a, third one-touch joint 21b, second one-touch joint 22a, fourth one-touch joint 22b, and connector 28 are connected thereto. Next, first exhaust passage 16a and second exhaust passage 16b are closed (ST6). That is, first exhaust valve 17a and second exhaust valve 17b are closed, and thus the gas inside first pipe 14a, second pipe 14b, and dust collector 20 of flux recovery device 5 is blocked not to exhaust the gas to the outside.

Next, $N_2$ gas is charged (ST7). That is, in a state in which $N_2$ gas generating device 6 is operated and $N_2$ gas can be supplied through $N_2$ gas supplying tubes 6a and 6b, first intake valve 19a and second intake valve 19b are opened, and $N_2$ gas flows the inside of first pipe 14a and the inside of second pipe 14b through first intake passage 18a and second intake passage 18b.

After that, flow passages of first pipe 14a and second pipe 14b are opened (ST8). That is, first pipe valve 15a and second pipe valve 15b are opened, and thus the gas is allowed to flow between flux recovery device 5 and reflow furnace 2. Accordingly, $N_2$ gas flowed to first pipe 14a and second pipe 14b reaches reflow furnace 2, and $N_2$ gas is charged inside of flux recovery device 5 and reflow furnace 2 and the entire circulate passage of the gas of flux recovery device 5 and reflow furnace 2. Accordingly, flux recovery device 5 becomes in the operating state, and the vaporized flux can be collected and recovered.

A process flow described above constitutes the gas exchange method inside flux recovery device 5 which recovers the vaporized flux being generated at the time of soldering electronic circuit board 7. In the gas exchange method, an example in which only first pipe 14a is used to a pipe passage for exchanging gas is described. That is, the process flow (ST1) described above is a first pipe closing process of closing the passage of first pipe 14a which causes the gas including the vaporized flux to pass in flux recovery device 5. (ST2) is a first exhaust passage opening process of opening first exhaust passage 16a provided in first pipe 14a. (ST6) is a first exhaust passage closing process of closing first exhaust passage 16a. Also, (ST7) which is a process of charging $N_2$ gas corresponds to first intake passage opening process of opening first intake passage 18a provided in first pipe 14a.

As described above, flux recovery device 5 included in reflow apparatus 1 illustrated in the embodiment recovers the vaporized flux being generated at the time of soldering electronic circuit board 7. Flux recovery device 5 includes first pipe 14a, dust collector 20, and first one-touch joint 21a. First pipe 14a causes the gas including the vaporized flux to pass through flux recovery device 5. Dust collector 20 solidifies the vaporized flux passed through first pipe 14a by the plasma discharger and then collects the flux. First one-touch joint 21a as first joint portion allows first pipe 14a and dust collector 20 to be attachable to and detachable from each other. With this configuration, at the time of the maintenance work, a work can be performed at a position with good working environment in which dust collector 20 is removed from first pipe 14a, and thus a workability of the maintenance work of the flux recovery device can be improved. In addition, in flux recovery device 5, pipe 4 includes first exhaust passage 16a provided in first pipe 14a and first intake passage 18a provided in first pipe 14a. Further, pipe 4 includes first exhaust valve 17a which opens and closes the passage of first exhaust passage 16a, first intake valve 19a which opens and closes the passage of first intake passage 18a, and first pipe valve 15a which opens and closes the passage of first pipe 14a.

With this configuration, at the time of the maintenance work of flux recovery device 5, an exchange work of exchanging the gas inside flux recovery device 5 is easily performed. That is, the first pipe closing process of closing the passage of first pipe 14a which causes the gas including the vaporized flux to pass, and the first exhaust passage opening process of opening first exhaust passage 16a provided in first pipe 14a are performed in flux recovery device 5, and thus the gas inside flux recovery device 5 can be exhausted through first exhaust passage 16a.

Further, the current controller which performs the constant current control of the plasma discharger is included, and thus the discharge amount of the plasma discharge can be appropriately controlled depending on the amount of the vaporized flux, although a state becomes the contamination state due to the flux inside flux recovery device 5.

Hitherto, the embodiment of this disclosure is described. Those skilled in the art understand that modification examples of combination of configuration elements and processes can be applied to the embodiment, and these modification examples are also included in the range of the disclosure.

The corona discharge is described with the plasma discharger described above as an example; however, as long as molecules of the vaporized flux are ionized into ions and electrons by applying a voltage, and the ionized ions and electrons can be collected by being attracted to the positive and negative electrodes of the dust collector, a discharging unit such as a glow discharge or an arc discharge may be used.

In addition, the example in which dust collector 20 is attachable and detachable is described above, but first dust collector 21 and second dust collector 22 may be respectively attachable to and detachable from each other.

The example in which $N_2$ gas generating device 6 is used is described above, but gas other than the $N_2$ gas may flow flux recovery device 5 and reflow furnace 2. According to the disclosure, the discharge amount of the plasma discharge can be controlled depending on the amount of the flux in the flux recovery device of a plasma discharge method.

The flux recovery device and the reflow apparatus of the disclosure include an effect of control the discharge amount of the plasma discharge depending on the amount of the flux in the flux recovery device in the plasma discharge method. Therefore, the flux recovery device and the reflow apparatus of the disclosure are useful in a field of placement of the electronic components to the electronic circuit board in a solder manner.

What is claimed is:

1. A flux recovery device which recovers vaporized flux being generated at a time of soldering an electronic circuit board on which electronic components are placed, the device comprising:
   a first pipe which causes gas including the vaporized flux to pass to the flux recovery device;
   a dust collector that solidifies the vaporized flux passed through the first pipe and collects dust, by a plasma discharge; and
   a current controller that performs a constant current control of the plasma discharge.

2. A reflow apparatus comprising the flux recovery device of claim 1.

3. The flux recovery device of claim 1,
   wherein the dust collector comprising a first dust collector and a second dust collector;
   wherein the first dust collector is configured to generate negative ions and
   the second dust collector is configured to generate positive ions.

4. The flux recovery device of claim 1,
   further comprising of a discharge controller that controls a discharge amount of the plasma discharge.

5. A flux recovery device which recovers vaporized flux being generated inside a reflow furnace at a time of soldering an electronic circuit board on which electronic components are placed, the device comprising:
   a first pipe which causes gas including the vaporized flux to pass to the flux recovery device;
   a dust collector that solidifies the vaporized flux passed through the first pipe and collects dust, by a plasma discharge; and
   a discharge controller that controls a discharge amount of the plasma discharge.

6. The flux recovery device of claim 5,
   wherein the discharge controller causes the discharge amount to be increased in proportion to increase of the number of the electronic circuit boards which are processed inside the reflow furnace.

7. The flux recovery device of claim 5,
   wherein the discharge controller causes the discharge amount to be increased in proportion to an elapse of an operation time of the reflow furnace.

8. A reflow apparatus comprising the flux recovery device of claim 5.

9. The flux recovery device of claim 5,
wherein the dust collector comprising a first dust collector and a second dust collector;
wherein the first dust collector is configured to generate negative ions and the second dust collector is configured to generate positive ions.

\* \* \* \* \*